(12) United States Patent
Lim et al.

(10) Patent No.: US 10,483,300 B2
(45) Date of Patent: Nov. 19, 2019

(54) OPTICALLY RESTORABLE SEMICONDUCTOR DEVICE, METHOD FOR FABRICATING THE SAME, AND FLASH MEMORY DEVICE USING THE SAME

(71) Applicant: Electronics and Telecommunications Research Institute, Daejeon (KR)

(72) Inventors: JungWook Lim, Daejeon (KR); Sun Jin Yun, Daejeon (KR); Tae Yoon Kim, Daejeon (KR); Jeho Na, Daejeon (KR); Seong Hyun Lee, Suwon-si (KR); Kwang Hoon Jung, Changwon-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 15/993,765

(22) Filed: May 31, 2018

(65) Prior Publication Data

US 2018/0350852 A1    Dec. 6, 2018

(30) Foreign Application Priority Data

Jun. 2, 2017 (KR) .................. 10-2017-0069253
Jan. 8, 2018 (KR) .................. 10-2018-0002438

(51) Int. Cl.
*H01L 27/144* (2006.01)
*H01L 31/113* (2006.01)
(Continued)

(52) U.S. Cl.
CPC ........ *H01L 27/1443* (2013.01); *G11C 13/047* (2013.01); *G11C 16/0466* (2013.01);
(Continued)

(58) Field of Classification Search
CPC ..... H01L 51/447; H01L 51/42; H01L 51/428; H01L 29/4232–42344; H01L 27/14609; H01L 27/14663
See application file for complete search history.

(56) References Cited

U.S. PATENT DOCUMENTS 5,194,396 A     3/1993  Kim et al.
2009/0267056 A1* 10/2009  Chang ................. H01L 27/283
                                                  257/40
(Continued)

FOREIGN PATENT DOCUMENTS

CN    103606564 A    2/2014
KR    10-0884887 B1  2/2009
(Continued)

OTHER PUBLICATIONS

L.A. Frolova et al., "Design of rewritable and read-only non-volatile optical memory elements using photochromic spiropyran-based salts as light-sensitive materials", Journal of Materials Chemistry C, 2015, pp. 11675-11680, vol. 3.
(Continued)

*Primary Examiner* — Frederick B Hargrove
(74) *Attorney, Agent, or Firm* — Rabin & Berdo, P.C.

(57) ABSTRACT

Provided is an optically restorable semiconductor device including a gate electrode, a gate insulation film on the gate electrode, a photo-responsive semiconductor film on the gate insulation film, and an interface charge part disposed adjacent to an interface between the photo-responsive semiconductor film and the gate insulation film, wherein the interface charge part includes charge traps, and the interface charge part and the photo-responsive semiconductor film directly contact with each other.

16 Claims, 7 Drawing Sheets

(51) Int. Cl.
    *H01L 31/0336*     (2006.01)
    *G11C 13/04*     (2006.01)
    *H01L 31/18*     (2006.01)
    *G11C 16/04*     (2006.01)
    *G11C 16/18*     (2006.01)
    *H01L 31/0296*     (2006.01)

(52) U.S. Cl.
    CPC .......... *G11C 16/18* (2013.01); *H01L 27/1446* (2013.01); *H01L 31/0336* (2013.01); *H01L 31/1136* (2013.01); *H01L 31/18* (2013.01); *H01L 31/0296* (2013.01)

(56) References Cited

U.S. PATENT DOCUMENTS

| | | |
|---|---|---|
| 2010/0097838 A1 | 4/2010 | Tanaka et al. |
| 2012/0153361 A1 | 6/2012 | Ahn et al. |
| 2014/0263945 A1* | 9/2014 | Huang .................. H01L 51/428 250/200 |

FOREIGN PATENT DOCUMENTS

| | | |
|---|---|---|
| KR | 10-2009-0084708 A | 8/2009 |
| KR | 10-1277052 B1 | 6/2013 |

OTHER PUBLICATIONS

Xing-Mei Cui et al., "Unique UV-Erasable In—Ga—Zn—O TFT Memory With Self-Assembled Pt Nanocrystals", IEEE Electron Device Letters, Aug. 2013, pp. 1011-1013, vol. 34, No. 8.

* cited by examiner

OPTICALLY RESTORABLE SEMICONDUCTOR DEVICE, METHOD FOR FABRICATING THE SAME, AND FLASH MEMORY DEVICE USING THE SAME

CROSS-REFERENCE TO RELATED APPLICATIONS

This U.S. non-provisional patent application claims priority under 35 U.S.C. § 119 to Korean Patent Application Nos. 10-2017-0069253, filed on Jun. 2, 2017, and 10-2018-0002438, filed on Jan. 8, 2018, the entire contents of which are hereby incorporated by reference herein.

BACKGROUND

The present inventive concepts relates to an optically restorable semiconductor device, a method for fabricating the same, and a flash memory device using the same.

Most semiconductor devices are driven by a voltage. For example, for a flash memory, a write operation may be performed by applying a voltage to a gate electrode, and an erase operation may be performed by applying a voltage to a substrate.

There have been attempts for applying, to a semiconductor device, a semiconductor material that receives light to generate an electron-hole pair, but there has not been a semiconductor device in which a write operation or an erase operation is performed only using light.

SUMMARY

Some embodiments of the present inventive concepts provide an optically restorable semiconductor device in which the electrical characteristics are controlled according to a voltage signal and an optical signal.

Some embodiments of the present inventive concepts also provide a method for fabricating an optically restorable semiconductor device in which the electrical characteristics are controlled according to a voltage signal and an optical signal.

Some embodiments of the present inventive concepts also provide a flash memory device using an optically restorable semiconductor device in which the electrical characteristics are controlled according to a voltage signal and an optical signal.

However, the purposes of the invention are not limited to the above-described disclosure.

According to exemplary embodiments of the present inventive concepts, an optically restorable semiconductor device including: a gate electrode; a gate insulation film on the gate electrode; a photo-responsive semiconductor film on the gate insulation film; and an interface charge part disposed adjacent to an interface between the photo-responsive semiconductor film and the gate insulation film, wherein the interface charge part includes charge traps, and the interface charge part and the photo-responsive semiconductor film directly contact with each other.

In some exemplary embodiments, the photo-responsive semiconductor film may have direct transition characteristics.

In some exemplary embodiments, the photo-responsive semiconductor film may include an oxide semiconductor material, a sulfide semiconductor material, or a selenide semiconductor material.

In some exemplary embodiments, the photo-responsive semiconductor film may include any one selected from among $ZnO$, $In_2O_3$, $SnO_2$, $TiO_2$, $MoO_X$, $MnO_X$, $Cu_2O$, $WO_X$, $ZnS$, $MoS_2$, $WS_2$, $MoSe_2$, $WSe_2$, $ZrS_2$, and $ZrSe_2$.

In some exemplary embodiments, the interface charge part may include an interface charge layer interposed between the photo-responsive semiconductor film and the gate insulation film, wherein the interface charge layer includes a material different from the photo-responsive semiconductor film.

In some exemplary embodiments, the interface charge layer includes $ZnO$, $In_2O_3$, $SnO_2$, $TiO_2$, $MoO_X$, $MnO_X$, $Cu_2O$, $WO_X$, $ZnS$, $MoS_2$, $WS_2$, $MoSe_2$, $WSe_2$, $ZrS_2$, $ZrSe_2$, graphene, $HfS_2$, $HFSe_2$, $SnS_2$, $SnSe_2$, or a combination thereof.

In some exemplary embodiments, the optically restorable semiconductor device may further include a plasma treatment area provided on the gate insulation film, wherein the plasma treatment area directly contact with the interface charge layer and includes deep traps.

In some exemplary embodiments, the optically restorable semiconductor device may further include a plasma treatment area provided on he interface charge layer, wherein the plasma treatment area includes deep traps.

In some exemplary embodiments, the interface charge part may include an interface charge area provided on the gate insulation film, wherein the interface charge area includes deep traps.

In some exemplary embodiments, the optically restorable semiconductor device may further include a passivation film provided on the photo-responsive semiconductor film, wherein the passivation film includes $SiO_2$, $SiON$, $SiN$, $Al_2O_3$, $AlSiO$, $AlON$, or a combination thereof.

In some exemplary embodiments, the optically restorable semiconductor device may further include: a control unit; and an optical source unit, wherein the control unit applies a trap voltage to the gate electrode, and the optical source unit is controlled by the control unit to irradiate light on the photo-responsive semiconductor film.

In some exemplary embodiments, electrical characteristics of the interface charge part may be controlled by each of the trap voltage and light.

In some exemplary embodiments, the trap voltage may be provided in plurality, wherein magnitudes of the plurality of trap voltages are different from each other.

In some exemplary embodiments, the light may be provided in plurality, wherein wavelengths of the plurality of lights may be different from each other.

According to exemplary embodiments of the present inventive concepts, a method of fabricating an optically restorable semiconductor device includes: providing a gate electrode; forming a gate insulation film on the gate electrode; forming a photo-responsive semiconductor film on the gate insulation film; and forming an interface charge part on an area adjacent to an interface between the gate insulation film and the photo-responsive semiconductor film, wherein the interface part includes charge traps.

In some exemplary embodiments, the forming of the interface charge part may include performing a plasma treatment process or a solution treatment process on a top surface of the gate insulation film, wherein the plasma treatment process includes exposing the top surface of the gate insulation film to a plasma, and the solution treatment process includes exposing the top surface of the gate insulation film to an acid.

In some exemplary embodiments, the plasma may be generated using a $H_2$ gas, an $O_2$ gas, a $Cl_2$ gas, a F gas, a gas including a hydrogen atom, or a mixed gas including at least two thereof.

In some exemplary embodiments, the acid may include any one of a sulfuric acid, a nitric acid, an acetic acid, a hydrochloric acid, and a hydrofluoric acid.

In some exemplary embodiments, the forming of the interface charge part may include forming an interface charge layer interposed between the gate insulation film and the photo-responsive semiconductor film, wherein the interface charge layer includes a material different from a material in the photo-responsive semiconductor film.

In some exemplary embodiments, the method may further include performing a plasma treatment process on a top surface of the interface charge layer, wherein the plasma treatment process includes exposing the top surface of the interface charge layer to plasma.

According to exemplary embodiments of the inventive concepts, a flash memory device includes: a substrate; a control gate separated from the substrate in a direction perpendicular to a bottom surface of the substrate; a gate insulation film provided between the substrate and the control gate; a floating gate interposed between the substrate and the gate insulation film; and a source electrode and drain electrode respectively disposed on both sides of the floating gate, wherein the substrate includes a photo-responsive semiconductor material, the floating gate includes charge traps, the substrate and the floating gate directly contact with each other, and a write operation and an erase operation are performed by a trap voltage applied to the control gate and light irradiated on the substrate.

In some exemplary embodiments, the photo-responsive semiconductor material may have direct transition characteristics.

In some exemplary embodiments, the substrate includes any one selected from among ZnO, $In_2O_3$, $SnO_2$, $TiO_2$, $MoO_X$, $MnO_X$, $Cu_2O$, $WO_X$, ZnS, $MoS_2$, $WS_2$, $MoSe_2$, $WSe_2$, $ZrS_2$, and $ZrSe_2$, wherein floating gate includes ZnO, $In_2O_3$, $SnO_2$, $TiO_2$, $MoO_X$, $MnO_X$, $Cu_2O$, $WO_X$, ZnS, $MoS_2$, $WS_2MoSe_2$, $WSe_2$, $ZrS_2$, $ZrSe_2$, graphene, $HfS_2$, $HFSe_2$, $SnS_2$, $SnSe_2$, or a combination thereof.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

The embodiments of the present invention will now be described with reference to the accompanying drawings for sufficiently understating a configuration and effects of the inventive concept. However, the inventive concept is not limited to embodiments disclosed in the following and may be embodied in different ways, and various modifications may be made thereto. The embodiments are just given to provide complete disclosure of the inventive concept and to provide thorough understanding of the inventive concept to those skilled in the art.

Like reference numerals refer to like elements throughout. Moreover, exemplary embodiments are described herein with reference to perspective views, front views, cross-sectional views and/or conceptual views that are idealized exemplary illustrations. In the drawings, the thicknesses of layers and regions are exaggerated for clarity. Thus, the regions illustrated in the figures are schematic in nature and their shapes may be not intended to illustrate the actual shape of a region of a device and are not intended to limit the scope of example embodiments. It will be understood that although the terms "first", "second", etc. may be used herein to describe various components, these components should not be limited by these terms. The terms are used only for distinguishing a constituent element from other constituent elements. Exemplary embodiments described and illustrated here include complementary exemplary embodiments thereof.

The terminology used herein is for the purpose of describing particular embodiments only and is not intended to limit the scope of the present disclosure. As used herein, the singular forms "a", "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Hereinafter, the embodiments of the present invention will now be described in detail with reference to the accompanying drawings.

Figure 1:
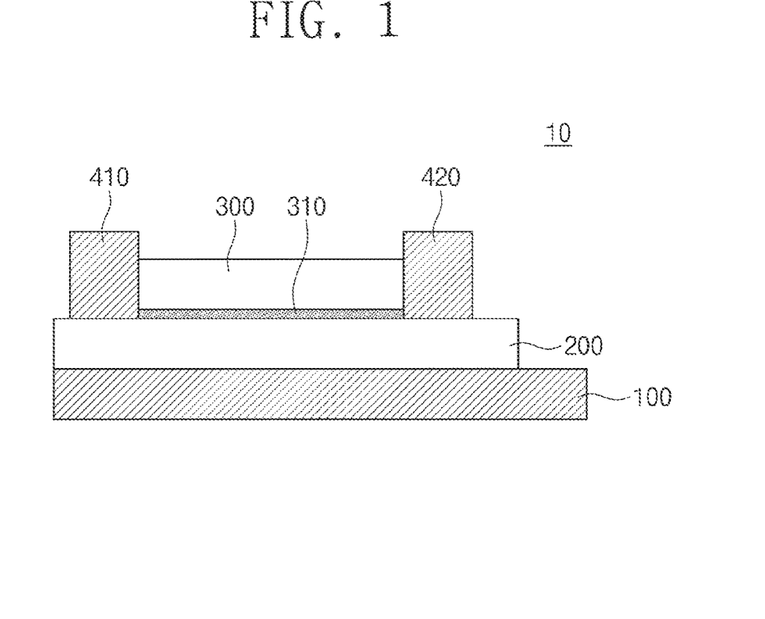
FIG. 1 is a cross-sectional view of an optically restorable semiconductor element according to exemplary embodiments of the present inventive concept.

FIG. 1 is a cross-sectional view of an optically restorable semiconductor element according to exemplary embodiments of the present inventive concept.

In relation to FIG. 1, the optically restorable semiconductor element 10 may be provided which includes a gate electrode 100, a gate insulation film 200, a photo-responsive semiconductor film 300, an interface charge layer 310, a drain electrode 410, and a source electrode 420. The gate electrode 100 may include a conductive material. For example, the gate electrode 100 may include a metal, a transparent conductive film, or doped polysilicon. In an exemplary embodiment, when all of the drain electrode 410, the source electrode 420, and the gate electrode 100 are provided with the transparent conductive films, a totally transparent semiconductor device may be provided.

The gate electrode 100 may be applied with a trap voltage or a channel voltage from an external power source (not shown) of the optically restorable semiconductor element 10. The trap voltage may allow carriers to flow into the interface charge layer 310, and the channel voltage may provide a channel under the photo-responsive semiconductor film 300. The trap voltage and the channel voltage will be described in detail later.

The gate insulation film 200 may be provided on the gate electrode 100. The gate insulation film 200 may electrically insulate the gate electrode 100 from the photo-responsive semiconductor film 300, the drain electrode 410, and the source electrode 420. The gate insulation film 200 may include a dielectric material. For example, the gate insulation film 200 may include $SiO_2$, SiON, $Al_2O_3$, $HfO_2$, $ZrO_2$, $TiO_2$, AlTiO, AlON, or a combination thereof.

The photo-responsive semiconductor film 300 may be provided on the gate insulation film 200. When irradiated with light, the photo-responsive semiconductor film 300 may receive the light to generate an electron-hole pair. The photo-responsive semiconductor film 300 may include a compound semiconductor having direct transition characteristics. For example, the photo-responsive semiconductor film 300 may include metal-oxide semiconductor (e.g. ZnO, $In_2O_3$, $SnO_2$, $TiO_2$, $MoO_X$, $MnO_X$, $Cu_2O$, $WO_X$, or mixture including one or more thereof, sulfide semiconductor (e.g. ZnS, $MoS_2$, $WS_2$, or mixture including one or more thereof), or selenide semiconductor (e.g. $MoSe_2$, $WSe_2$, $ZrS_2$, $ZrSe_2$, or mixture including one or more thereof). In an exemplary embodiment, the photo-responsive semiconductor film 300 may have an n conductive type, and include electron carriers. In another embodiment, the photo-responsive semiconductor film 300 may have a p conductive type, and include hole carriers. The thickness of the photo-responsive semiconductor film 300 may be several nm and several hundred nm.

The interface charge layer 310 may be provided between the photo-responsive semiconductor film 300 and the gate insulation film 200. The interface charge layer 310 may directly contact with the photo-responsive semiconductor film 300 and the gate insulation film 200. The interface charge layer 310 may have charge traps, and include thin film. The interface charge layer 310 may include a thin film. For example, the interface charge layer 310 may include one selected from among thin films of ZnO, $In_2O_3$, $SnO_2$, $TiO_2$, $MoO_X$, $MnO_X$, $Cu_2O$, $WO_X$, ZnS, $MoS_2$, $WS_2$, $MoSe_2$, $WSe_2$, $ZrS_2$, $ZrSe_2$, graphene, $HfS_2$, $HfSe_2$, $SnS_2$, or $SnSe_2$. For example, the thickness of the interface charge layer 310 may be about 0.1 nm to about 10 nm. A material in the interface charge layer 310 may be different from that in the photo-responsive semiconductor film 300. For example, when the photo-responsive semiconductor film includes $TiO_2$, the interface charge layer 310 may include AlTiO or TiSiO.

The gate electrode 100 may receive a trap voltage from an external power source of the optically restorable semiconductor element 10 to form an electric field penetrating the photo-responsive semiconductor film 300 and the interface charge layer 310. The electronic carriers (or hole carriers) of the photo-responsive semiconductor film 300 may move to the interface charge layer 310 by the electrical field. The interface charge layer 310 may trap the electron carriers (or hole carriers). When the interface charge layer 310 traps the electronic carriers, the interface charge layer 310 may appear electrically negative. When the interface charge layer 310 traps the hole carriers, the interface charge layer 310 may appear electrically positive. A state in which the interface charge layer 310 is electrically negative or positive may be defined as a first state of the optically restorable semiconductor element 10.

When the optically restorable semiconductor element 10 in the first state is irradiated with light, holes (or electrons) generated in the photo-responsive semiconductor film 300 are flowed into the interface charge layer 310 to couple with the trapped electron carriers (or hole carriers). Accordingly, at least a part of the interface charge layer 310 may have an electrically neutral state. The state in which at least part of the interface charge layer 310 is neutral may be defined as a second state of the optically restorable semiconductor element 10. In an exemplary embodiment, changing the state of the optically restorable semiconductor element 10 from the first state to the second state may include irradiating the photo-responsive semiconductor film 300 with light without applying a voltage to the gate electrode 100. Changing the state of the optically restorable semiconductor element 10 from the second state to the first state may include applying a voltage to the gate electrode 100 without irradiating the photo-responsive semiconductor film 300 with light.

The drain electrode 410 and the source electrode 420 may be provided on the gate insulation film 200. The drain electrode 410 and the source electrode 420 may be respectively provided on both sides of the photo-responsive semiconductor film 300. The drain electrode 410 and the source electrode 420 may be respectively and electrically connected to the both sides of the photo-responsive semiconductor film 300. The drain electrode 410 and the source electrode 420 may include a conductive material. For example, each of the drain electrode 410 and the source electrode 420 may include a metal, a transparent conductive film, or doped polysilicon.

In an exemplary embodiment of the inventive concept, the optically restorable semiconductor element 10 may correspond to an existing flash memory element. For example, the interface charge layer 310 may correspond to a floating gate of the existing flash memory element. However, unlike the existing flash memory element, the optically restorable semiconductor element 10 does not include a configuration corresponding to a tunneling barrier layer of the existing flash memory element. For the existing flash memory element, a write operation and an erase operation are performed with a voltage, but for the optically restorable semiconductor element 10, a write operation and an erase operation may be performed with each of light and a voltage.

An electrical state (neutral, negative or positive) of the interface charge layer 310 according to an embodiment of the inventive concept may be controlled by a trap voltage applied to the gate electrode 100 and light irradiated on the photo-responsive semiconductor film 300. At least a part of the interface charge layer 310 has an electrically neutral state (i.e. when the optically restorable semiconductor element 10 is in the second state), a channel may be formed in the photo-responsive semiconductor film 300 by an electrical field generated by a channel voltage. When the interface charge layer 310 has an electrical polarity (i.e. when the optically restorable semiconductor element 10 is in the first state), the channel may be formed in the photo-responsive semiconductor film 300 by an electrical field generated by a channel voltage and an electrical field generated by the interface charge layer 310. A threshold voltage of the optically restorable semiconductor element 10 may be changed according to an electrical state of the interface charge layer 310. For example, the threshold voltage, when the interface charge layer 310 is electrically negative, may be higher than that when at least a part of the interface charge layer 310 is electrically neutral. In other words, the threshold voltage of the optically restorable semiconductor element 10 may be controlled by a voltage applied to the gate electrode 100 and light irradiated on the photo-responsive semiconductor film 300. Consequently, the electrical state of the optically restorable semiconductor element 10 may be controlled by the trap voltage applied to the gate electrode and the light irradiated on the photo-responsive semiconductor film 300.

Figure 2:
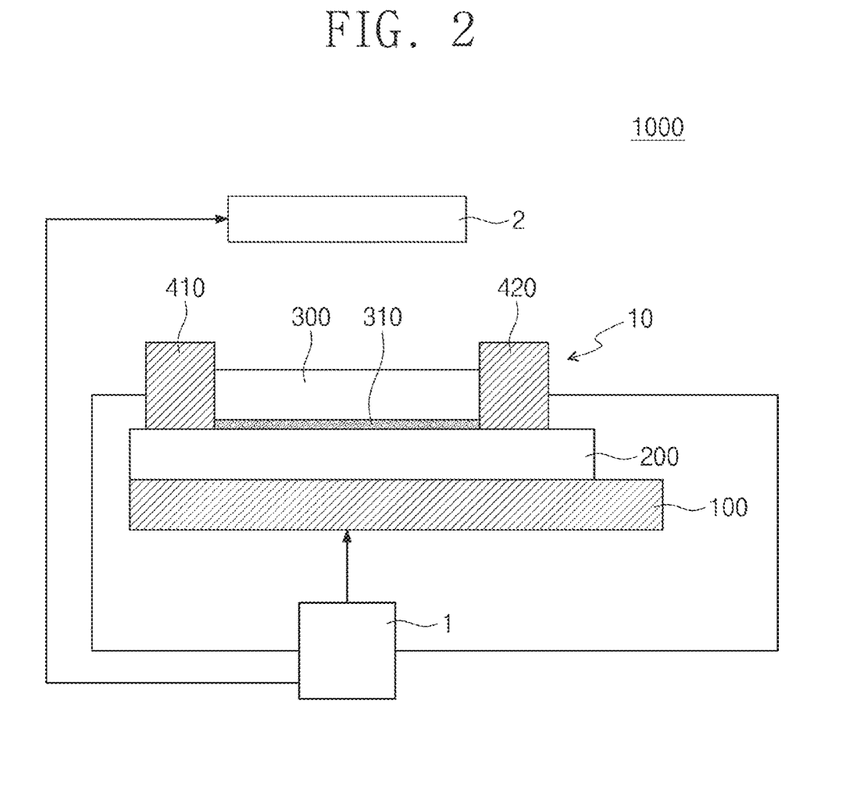
FIG. 2 illustrates a first state of the optically restorable semiconductor element according to exemplary embodiments of the present inventive concept.
Figure 3:
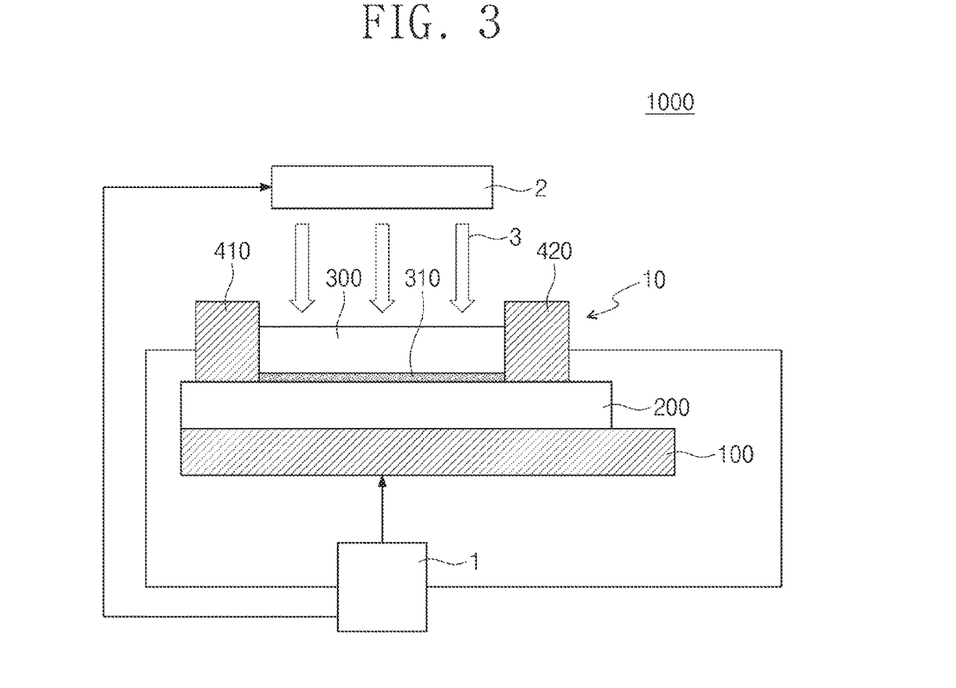
FIG. 3 illustrates a second state of the optically restorable semiconductor element according to exemplary embodiments of the present inventive concept.
Figure 4:
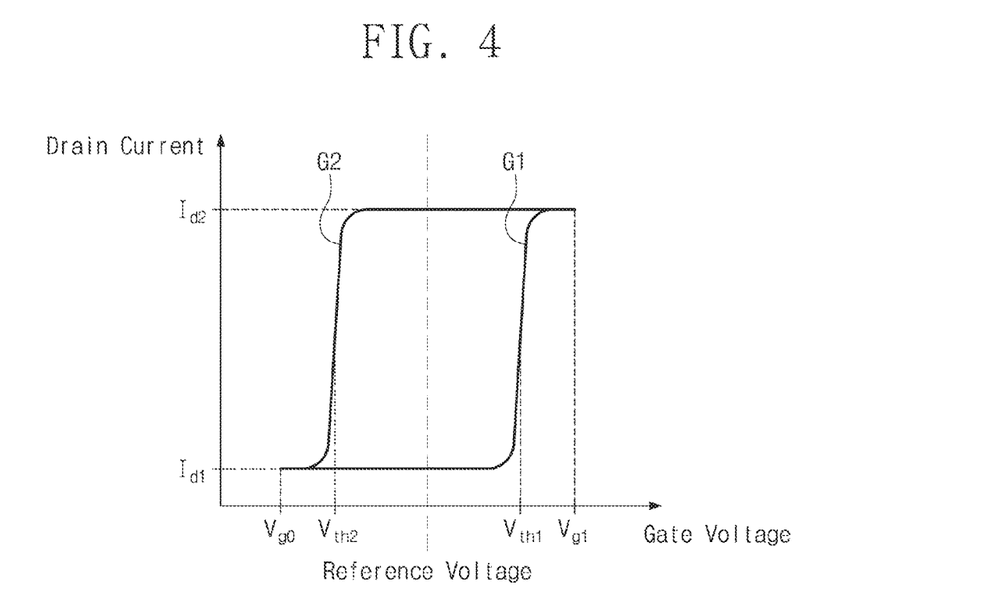
FIG. 4 shows gate voltage-drain current graphs of the optically restorable semiconductor element having the first and second states according to exemplary embodiments of the present inventive concept.

FIG. 2 illustrates the first state of the optically restorable semiconductor element according to exemplary embodiments of the present inventive concept. FIG. 3 illustrates the second state of the optically restorable semiconductor element according to exemplary embodiments of the present inventive concept. FIG. 4 shows gate voltage-drain current graphs of the optically restorable semiconductor element having the first and second states according to exemplary embodiments of the present inventive concept. For conciseness of description, a case where the electron carriers are trapped in the interface charge layer 310 will be described, and the substantially same content as the description in relation to FIG. 1 may not be described.

In relation to FIG. 2, an optically restorable semiconductor device 1000 including the optically restorable semiconductor element 10, a control unit 1, and an optical source unit 2 may be provided. The optically restorable semiconductor element 10 may be substantially identical to that having been described in relation to FIG. 1. The control unit 1 may apply a trap voltage to the gate electrode 100. Here, the control unit 1 may control the optical source unit 2 such that light is not emitted. The trap voltage may be a pulse-type voltage. For example, the magnitude of the pulse of the pulse-type voltage may be about 0.1 V to about 100 V. As having been described in relation to FIG. 1, when the trap voltage is applied to the gate electrode 100, the electron carriers in the photo-responsive semiconductor film 300 may be flowed into the interface charge layer 310 and trapped by traps in the interface charge layer 310. Accordingly, the interface charge layer 310 may appear electrically negative.

In an exemplary embodiment of the inventive concept, the optically restorable semiconductor element 10 may correspond to the existing flash memory element. For example, the interface charge layer 310 may correspond to a floating gate of the existing flash memory element. However, unlike the existing flash memory element, the optically restorable semiconductor element 10 does not include a configuration corresponding to a tunneling barrier layer of the existing flash memory element. For the existing flash memory element, a write operation and an erase operation are performed with a voltage, but for the optically restorable semiconductor element 10, a write operation and an erase operation may be performed with each of light and a voltage.

In relation to FIG. 3, the control unit 1 may control the optical source unit 2 such that the photo-responsive semiconductor film 300 is irradiated with light 3. The control unit 1 may not apply a trap voltage to the gate electrode 100. Accordingly, the gate electrode 100 may not provide an electric field in the photo-responsive semiconductor film 300. As described in relation to FIG. 1, the photo-responsive semiconductor film 300 may be irradiated with light to generate an electron-hole pair therein. The holes in the electron-hole pairs may be coupled with electron carriers flowed into the interface charge layer 310 and trapped therein. Accordingly, the interface charge layer 310 may have an electrically neutral state.

In relation to FIG. 4, a gate voltage-drain current graph G1 of the optically restorable semiconductor element 10 may be provided which has a first state, and a gate voltage-drain current graph G2 of the optically restorable semiconductor element 10 may be provided which has a second state. The gate-voltage-drain current graphs may represent a drain current flowing between the drain electrode 410 and the source electrode 420 according to the magnitude of a voltage (namely, a channel voltage) applied to the gate electrode. The gate voltage may be changed from a first gate voltage $V_{g0}$ to a second gate voltage $V_{g1}$ greater than the first gate voltage $V_{g0}$. According to the change in gate voltage, the drain current may be changed from a first drain current $I_{d1}$ to a second drain current $I_{d2}$ greater than the first drain current $I_{d1}$. Typically, the threshold voltage may be a gate voltage when the magnitude of the drain current is sharply changed. The threshold voltage herein may be a gate voltage, when the drain current may have a median value of the first and second drain current $I_{d1}$ and $I_{d2}$. A reference voltage may be a gate voltage for checking a state of the optically restorable semiconductor element 10. The optically restorable semiconductor element 10 in a first state may have a first threshold voltage $V_{th1}$. The first threshold voltage $V_{th1}$ may be controlled according to the magnitude of the trap voltage and an application time. For example, as the magnitude of the trap voltage is larger and the application time is longer, the threshold voltage $V_{th1}$ may become larger. The first threshold voltage $V_{th1}$ may become larger, until all the electron carriers are trapped by the traps in the interface charge layer 310.

The optically restorable semiconductor element 10 in a second state may have a second threshold voltage $V_{th2}$. The second threshold voltage $V_{th2}$ may be controlled according to a wavelength and an irradiation time of the light. For example, as the wavelength of the light is shorter and the irradiation time is longer, the threshold voltage $V_{th2}$ may become smaller. The second threshold voltage $V_{th2}$ may become smaller until all the electron carriers are removed and the interface charge layer 310 has an electrically neutral state.

The state of the optically restorable semiconductor element 10 according to an embodiment of the inventive concept may be checked using the reference voltage. In a case where the optically restorable semiconductor element 10 has a first state, the first drain current $I_{d1}$ may flow to a channel, when the reference voltage is applied to the gate electrode 100. In a case where the optically restorable semiconductor element 10 has a second state, the second drain current $I_{d2}$ may flow to the channel when the reference voltage is applied to the gate electrode 100. The control unit 1 may measure the magnitude of the drain current according to the reference voltage, and determine the state of the optically restorable semiconductor element 10.

Figure 5:
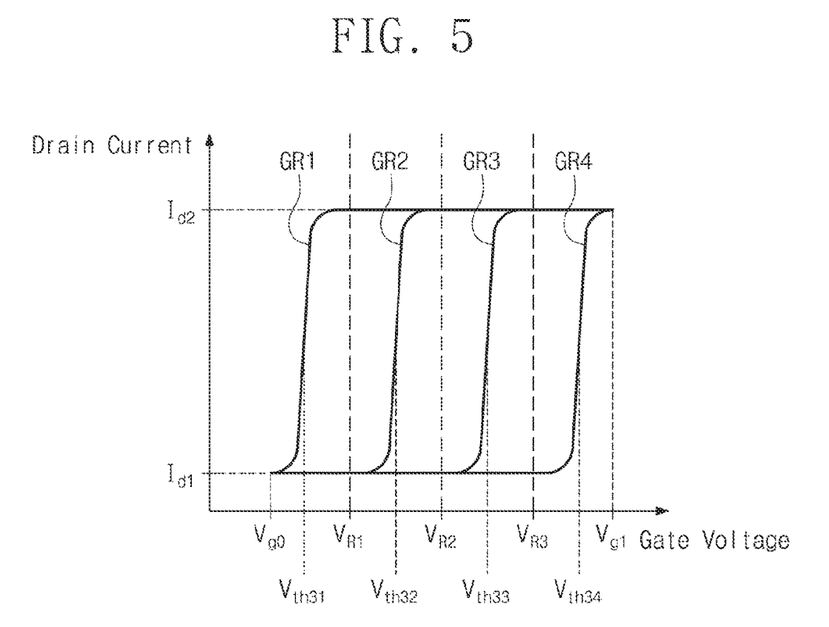
FIGS. 5 and 6 are graphs for describing multiple states of the optically restorable semiconductor element according to exemplary embodiments of the present inventive concept.
Figure 6:
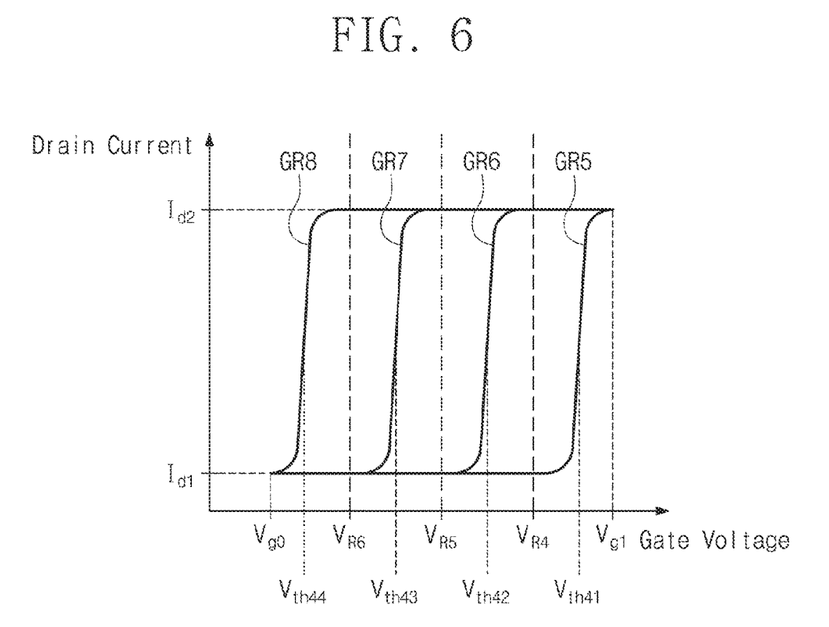

FIGS. 5 and 6 are graphs for describing multiple states of the optically restorable semiconductor element according to exemplary embodiments of the present inventive concept. For conciseness of explanation, content substantially identical to those having been described in relation to FIGS. 2 to 4 may not be described.

In relation to FIG. 5, first to fourth graphs GR1, GR2, GR3, and GR4 may be provided which represent a relationship between the gate voltage and drain current of the optically restorable semiconductor element 10 in 3-1st to 3-4th states. In 3-1st to 3-4th states, the optically restorable semiconductor element 10 may have respectively 3-1st to 3-4th threshold voltages $V_{th31}$, $V_{th32}$, $V_{th33}$, and $V_{th34}$.

When a first trap voltage is applied to the optically restorable semiconductor element 10 in the 3-1st state, the optically restorable semiconductor element 10 may be changed to have the 3-2nd state. The gate voltage-drain current graph of the optically restorable semiconductor element 10 may be changed from the first graph GR1 to the second graph GR2. The magnitude of the 3-2nd threshold voltage $V_{th32}$ may be larger than that of the 3-1st threshold voltage $V_{th31}$.

When a second trap voltage is applied to the optically restorable semiconductor element 10 in the 3-1st state, the optically restorable semiconductor element 10 may be changed to have the 3-3rd state. The magnitude of the second trap voltage may be larger than that of the first trap voltage. The application time of the second trap voltage may be longer than that of the first trap voltage. The gate voltage-drain current graph of the optically restorable semiconductor element 10 may be changed from the first graph GR1 to the third graph GR3. The magnitude of the 3-3rd threshold voltage $V_{th33}$ may be larger than that of the 3-2nd threshold voltage $V_{th32}$.

When a third trap voltage is applied to the optically restorable semiconductor element 10 in the 3-1st state, the optically restorable semiconductor element 10 may be changed to have the 3-4th state. The magnitude of the third trap voltage may be larger than that of the second trap voltage. The application time of the third trap voltage may be longer than that of the second trap voltage. The gate voltage-drain current graph of the optically restorable semiconductor element 10 may be changed from the first graph GR1 to the fourth graph GR4. The magnitude of the 3-4th threshold voltage $V_{th34}$ may be larger than that of the 3-3rd threshold voltage $V_{th33}$.

The control unit 1 may measure the states of the optically restorable semiconductor element 10 using first to third reference voltages $V_{R1}$, $V_{R2}$, and $V_{R3}$. The magnitude of the first reference voltage may be larger than that of the 3-1st threshold voltage $V_{th31}$, and smaller than that of the 3-2nd threshold voltage $V_{th32}$. The magnitude of the second reference voltage may be larger than that of the 3-2nd threshold voltage $V_{th32}$, and smaller than that of the 3-3rd threshold voltage $V_{th33}$. The magnitude of the third reference voltage may be larger than that of the 3-3rd threshold voltage $V_{th33}$, and smaller than that of the 3-4th threshold voltage $V_{th34}$.

In relation to FIG. 6, fifth to eighth graphs GR5, GR6, GR7, and GR8 may be provided which represent a relationship between the gate voltages and drain currents of the optically restorable semiconductor element 10 in 4-1st to 4-4th states. The optically restorable semiconductor element 10 in 4-1st to 4-4th states may have respectively 4-1st to 4-4th threshold voltages $V_{th41}$, $V_{th42}$, $V_{th43}$, and $V_{th44}$.

When first light is applied to the optically restorable semiconductor element 10 in the 4-1st state, the optically restorable semiconductor element 10 may be changed to have the 4-2nd state. The gate voltage-drain current graph of the optically restorable semiconductor element 10 may be changed from the fifth graph GR5 to the sixth graph GR6. The magnitude of the 4-2nd threshold voltage $V_{th42}$ may be smaller than that of the 4-1st threshold voltage $V_{th41}$.

When second light is applied to the optically restorable semiconductor element 10 in the 4-1st state, the optically restorable semiconductor element 10 may be changed to have the 4-3rd state. The wavelength of the second light may be shorter than that of the first light. The irradiation time of the second light may be longer than that of the first light. The gate voltage-drain current graph of the optically restorable semiconductor element 10 may be changed from the fifth graph GR5 to the sixth graph GR6. The magnitude of the 4-3rd threshold voltage $V_{th43}$ may be smaller than that of the 4-2nd threshold voltage $V_{th42}$.

When third light is applied to the optically restorable semiconductor element 10 in the 4-1st state, the optically restorable semiconductor element 10 may be changed to have the 4-4th state. The wavelength of the third light may be shorter than that of the second light. The irradiation time of the third light may be longer than that of the second light. The gate voltage-drain current graph of the optically restorable semiconductor element 10 may be changed from the sixth graph GR6 to the seventh graph GR7. The magnitude of the 4-4th threshold voltage $V_{th44}$ may be smaller than that of the 4-3rd threshold voltage $V_{th43}$.

The control unit 1 may sense the states of the optically restorable semiconductor element 10 using fourth to sixth reference voltages VR4, VR5, and VR6. The magnitude of the fourth reference voltage may be smaller than that of the 4-1st threshold voltage $V_{th41}$, and larger than that of 4-2nd threshold voltage $V_{th42}$. The magnitude of the fifth reference voltage may be smaller than that of the 4-2nd threshold voltage $V_{th42}$, and larger than that of 4-3rd threshold voltage $V_{th43}$. The magnitude of the sixth reference voltage may be smaller than that of the 4-3rd threshold voltage $V_{th43}$, and larger than that of 4-4th threshold voltage $V_{th44}$.

Typically, a semiconductor element may have two states (e.g., an on state or off state).

A quantity of the electron carriers (or hole carriers) trapped by the interface charge layer 310 according to an embodiment of the inventive concept may be adjusted according to the magnitude and/or application time of the trap voltage, or the wavelength and/or irradiation time of the light. Accordingly, the optically restorable semiconductor element 10 may have multiple states of three or more.

Figure 7:
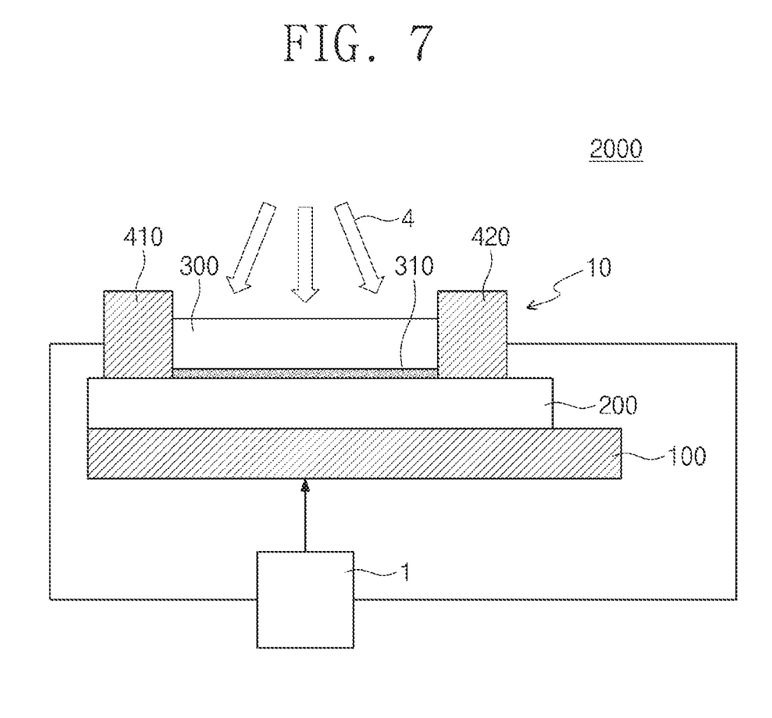
FIG. 7 is a conceptual view for describing the optically restorable semiconductor device according to exemplary embodiment present of the present inventive concept.

FIG. 7 is a conceptual view for describing the optically restorable semiconductor device according to exemplary embodiments of the present inventive concept. For conciseness of description, a case where the electron carriers are trapped in the interface charge layer 310 will be described, and the substantially same content as the description in relation to FIG. 1 may not be described.

In relation to FIG. 7, am optical sensor 2000 which includes an optically restorable semiconductor element 10 and the control unit 1 may be provided. The optically restorable semiconductor element 10 may be substantially identical to that having been described in relation to FIG. 1.

Before the photo-responsive semiconductor film 300 is irradiated with external light 4, a trap voltage may be applied to the gate electrode 100. Accordingly, the interface charge layer 310 may trap the electron carriers to appear electrically negative. When the photo-responsive semiconductor film 300 is irradiated with the external light 4, electron-hole pairs may be formed in the photo-responsive semiconductor film 300. The holes in the electron-hole pairs may flow into the interface charge layer 310 and couple with the trapped electrons to reduce the quantity of the electron carriers trapped in the interface charge layer 310. Accordingly, a threshold voltage of the optically restorable semiconductor element 10 may become smaller. The control unit 1 may sense a change amount of the threshold voltage to derive a wavelength value of the external light from the change amount. After the measurement of the external light 4, the control unit 1 may apply the trap voltage to the gate electrode 100 to make the interface charge layer 310 an initial state.

An electrical state of the optical sensor 2000 according to an embodiment of the inventive concept may be controlled by the trap voltage applied to the gate electrode 100 and light irradiated on the photo-responsive semiconductor film 300.

Figure 8:
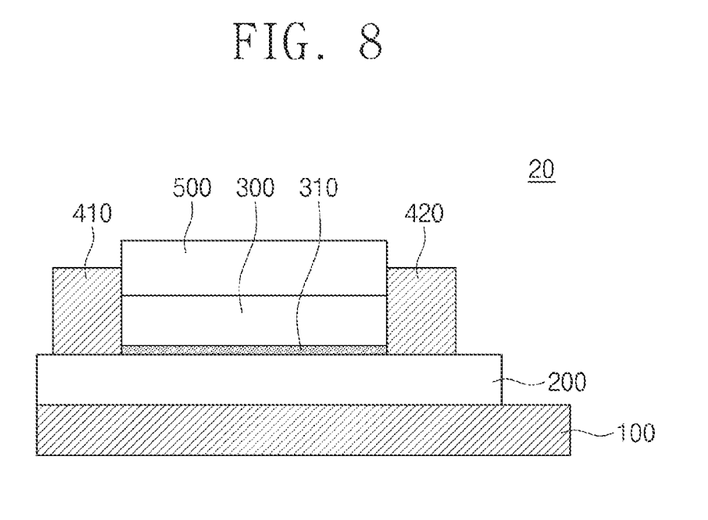
FIG. 8 is a cross-sectional view of the optically restorable semiconductor element according to exemplary embodiments of the present inventive concept.

FIG. 8 is a cross-sectional view of an optically restorable semiconductor element according to exemplary embodiments of the present inventive concept. For conciseness of explanation, content substantially identical to that having been described in relation to FIG. 1 may not be described.

In relation to FIG. 8, the optically restorable semiconductor element 20 may be provided which includes a gate electrode 100, a gate insulation film 200, a photo-responsive semiconductor film 300, and a passivation film 500 that are sequentially laminated, an interface charge layer 310 interposed between the gate insulation film 200 and the photo-responsive semiconductor film 300, a drain electrode 410 and a source electrode 420 provided on the gate insulation film 200.

The gate electrode 100, the gate insulation film 200, the photo-responsive semiconductor film 300, the interface charge layer 310, the drain electrode 410 and the source electrode 420 may be substantially the same as those having been described in relation to FIG. 1.

The passivation film 500 may protect the photo-responsive semiconductor film 300 from an external deterioration source. For example, the passivation film 500 may prevent the water or oxygen from penetrating into a channel layer in the photo-responsive semiconductor film 300. The passivation film 500 may include an insulation material. For example, the passivation film 500 may includes $SiO_2$, SiON, SiN, $Al_2O_3$, AlSiO, AlON, or a combination thereof.

In an exemplary embodiment of the inventive concept, the optically restorable semiconductor element 20 may correspond to the existing flash memory element. For example, the interface charge layer 310 may correspond to a floating gate of the existing flash memory element. However, unlike the existing flash memory element, the optically restorable semiconductor element 20 does not include a configuration corresponding to a tunneling barrier layer of the existing flash memory element. For the existing flash memory element, a write operation and an erase operation are performed with a voltage, but for the optically restorable semiconductor element 20, a write operation and an erase operation may be performed with each of light and a voltage.

An electrical state of the optically restorable semiconductor element 20 according to an embodiment of the inventive concept may be controlled by a trap voltage applied to the gate electrode 100 and the light irradiated on the photo-responsive semiconductor film 300.

Figure 9:
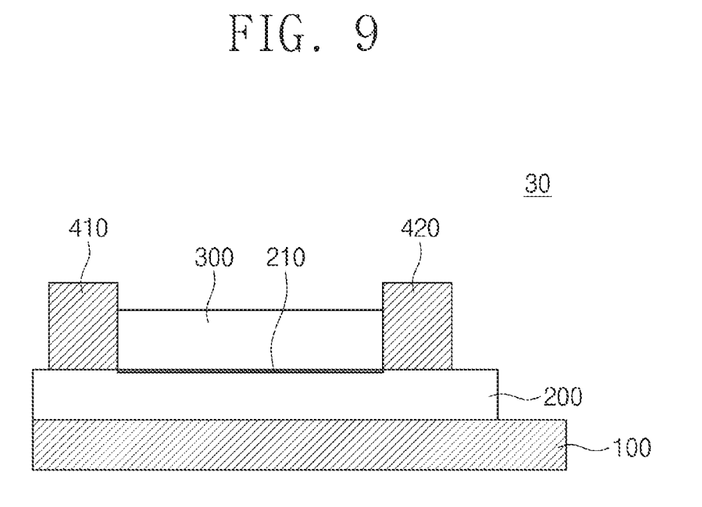
FIG. 9 is another cross-sectional view of an optically restorable semiconductor element according to exemplary embodiments of present the inventive concept.

FIG. 9 is a cross-sectional view of the optically restorable semiconductor element according to exemplary embodiments of the present inventive concept. For conciseness of explanation, content substantially identical to that having been described in relation to FIG. 1 may not be described.

In relation to FIG. 9, an optically restorable semiconductor element 30 may be provided which includes a gate electrode 100, a gate insulation film 200, and a photo-responsive semiconductor film 300 that are sequentially laminated, a drain electrode 410 and a source electrode 420 provided on the gate insulation film 200.

The gate electrode 100, the photo-responsive semiconductor film 300, the drain electrode 410 and the source electrode 420 may be substantially identical to those having been illustrated in relation to FIG. 1.

An interface charge area 210 may be included in the top surface of the gate insulation film 200. Similarly to the interface charge layer 310, the interface charge area 210 may trap charges flowed from the photo-responsive semiconductor film 300. When the electrons are trapped in the interface charge area 210, the interface charge area 210 may appear electrically negative. When the holes are trapped in the interface charge area 210, the interface charge area 210 may appear electrically positive.

The interface charge area 210 may be formed by performing a plasma treatment process or a solution treatment process on the top surface of the gate insulation film 200. The plasma treatment process may include providing, to the top surface of the gate insulation film 200, a plasma generated by using an Ar gas, an $O_2$ gas, a $N_2$ gas, a $H_2$ gas, a $N_2O$ gas, a gas including a hydrogen atom, or a mixed gas including at least two thereof for about 10 second or about 10 minutes. The solution treatment process may include exposing the top surface of the gate insulation film 200 to an acid. For example, the acid may be a sulfuric acid, a nitric acid, an acetic acid, a hydrochloric acid, a hydrofluoric acid, or a combination thereof.

In an exemplary embodiment of the inventive concept, the optically restorable semiconductor element 30 may correspond to the existing flash memory element. For example, the interface charge area 210 may correspond to a floating gate of the existing flash memory element. However, unlike the existing flash memory element, the optically restorable semiconductor element 30 does not include a configuration corresponding to a tunneling barrier layer of the existing flash memory element. For the existing flash memory element, a write operation and an erase operation are performed with a voltage, but for the optically restorable semiconductor element 30, a write operation and an erase operation may be performed with each of light and a voltage.

An electrical state of the optically restorable semiconductor element 30 according to an embodiment of the inventive concept may be controlled by the trap voltage applied to the gate electrode 100 and the light irradiated on the photo-responsive semiconductor film 300.

Figure 10:
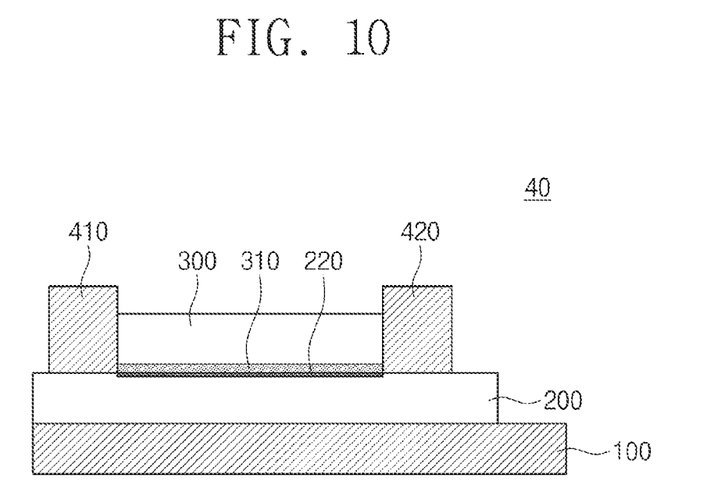
FIG. 10 is another cross-sectional view of an optically restorable semiconductor element according to exemplary embodiments of the present inventive concept.

FIG. 10 is a cross-sectional view of an optically restorable semiconductor element according to exemplary embodiments of the present inventive concept. For conciseness of explanation, content substantially identical to that having been described in relation to FIG. 1 may not be described.

In relation to FIG. 10, an optically restorable semiconductor element 40 may be provided which includes a gate electrode 100, a gate insulation film 200, a photo-responsive semiconductor film 300, an interface charge layer 310, a drain electrode 410, and a source electrode 420.

The gate electrode 100, the gate insulation film 200, the photo-responsive semiconductor film 300, the interface charge layer 310, the drain electrode 410 and the source electrode 420 may be substantially the same as those having been illustrated in relation to FIG. 1.

Unlike the illustrated in FIG. 1, a plasma treatment area 220 may be provided on the top surface of the gate insulation film 200. The plasma treatment area 220 may be formed by a plasma treatment process. The plasma treatment process may include exposing the top surface of the gate insulation film 200 to the plasma. The plasma may be generated using a $H_2$ gas, an $O_2$ gas, a $Cl_2$ gas, a F gas, a gas including a hydrogen atom, or a mixed gas including at least two thereof. The output of the plasma may be about 10 W to about 10,000 W. The plasma treatment process may be performed with an in-situ process, after the gate insulation film 200 is formed. The plasma treatment process may be performed for about 0.2 second to 300 seconds.

Shallow traps in the interface charge layer 310 may be removed by the plasma treatment area 220, and deep traps may remain. Accordingly, the durability and reproducibility of the optically restorable semiconductor element 40 may be improved.

In an exemplary embodiment of the inventive concept, the optically restorable semiconductor element 40 may correspond to the existing flash memory element. For example, the interface charge layer 310 may correspond to a floating gate of the existing flash memory element. However, unlike the existing flash memory element, the optically restorable semiconductor element 40 does not include a configuration corresponding to a tunneling barrier layer of the existing flash memory element. For the existing flash memory element, a write operation and an erase operation are performed with a voltage, but for the optically restorable semiconductor element 40, a write operation and an erase operation may be performed with each of light and a voltage.

An electrical state of the optically restorable semiconductor element 40 according to an embodiment of the inventive concept may be controlled by the trap voltage applied to the gate electrode 100 and the light irradiated on the photo-responsive semiconductor film 300.

Figure 11:
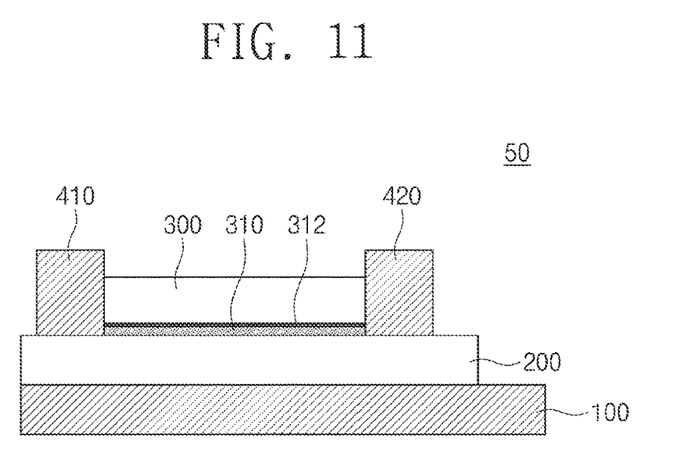
FIG. 11 is another cross-sectional view of an optically restorable semiconductor element according to exemplary embodiments of the present inventive concept.

FIG. 11 is a cross-sectional view of an optically restorable semiconductor element according to exemplary embodiments of the present inventive concept. For conciseness of explanation, content substantially identical to that having been described in relation to FIG. 1 may not be described.

In relation to FIG. 11, an optically restorable semiconductor element 50 may be provided which includes a gate electrode 100, a gate insulation film 200, a photo-responsive semiconductor film 300, an interface charge layer 310, a drain electrode 410 and a source electrode 420.

The gate electrode 100, the gate insulation film 200, the photo-responsive semiconductor film 300, the interface charge layer 310, the drain electrode 410 and the source electrode 420 may be substantially identical to those having been illustrated in relation to FIG. 1.

Unlike the illustrated in FIG. 1, a plasma treatment area 312 may be provided on the top surface of the interface charge layer 310. The plasma treatment area 312 may be formed by a plasma treatment process. The plasma treatment process may include exposing the top surface of the interface charge layer 310 to the plasma. The plasma may be generated using a $H_2$ gas, an $O_2$ gas, a $Cl_2$ gas, a F gas, a gas including a hydrogen atom, or a mixed gas including at least two thereof. The output of the plasma may be about 10 W to about 10,000 W. The plasma treatment process may be performed with an in-situ process, after the interface charge layer 310 is formed. The plasma treatment process may be performed for about 0.2 second to 300 seconds.

Shallow traps in the interface charge layer 310 may be removed by the plasma treatment area 220, and deep traps may remain. Accordingly, the durability and reproducibility of the optically restorable semiconductor element 50 may be improved.

In an exemplary embodiment of the inventive concept, the optically restorable semiconductor element 50 may correspond to the existing flash memory element. For example, the interface charge layer 310 may correspond to a floating gate of the existing flash memory element. However, unlike the existing flash memory element, the optically restorable semiconductor element 50 does not include a configuration corresponding to a tunneling barrier layer of the existing flash memory element. For the existing flash memory element, a write operation and an erase operation are performed with a voltage, but for the optically restorable semiconductor element 50, a write operation and an erase operation may be performed with each of light and a voltage.

An electrical state of the optically restorable semiconductor element 50 according to an embodiment of the inventive concept may be controlled by the trap voltage applied to the gate electrode 100 and the light irradiated on the photo-responsive semiconductor film 300.

Figure 12:
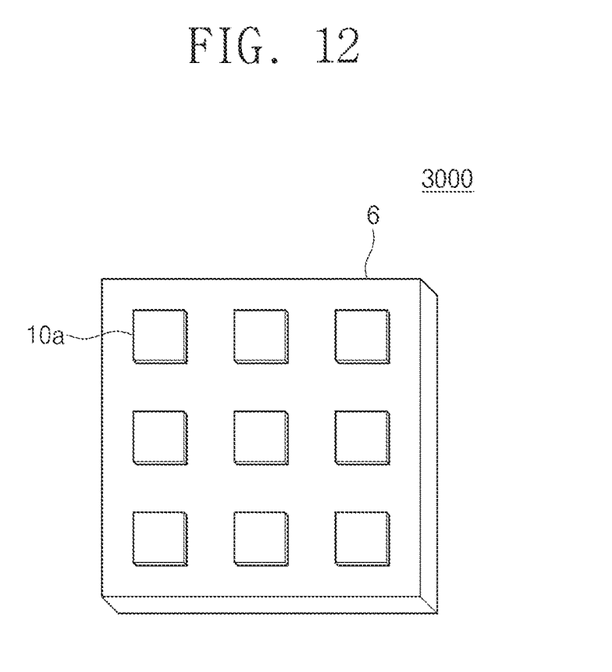
FIGS. 12 to 14 are conceptual views of an optically restorable semiconductor device according to exemplary embodiments of the present inventive concept.
Figure 13:
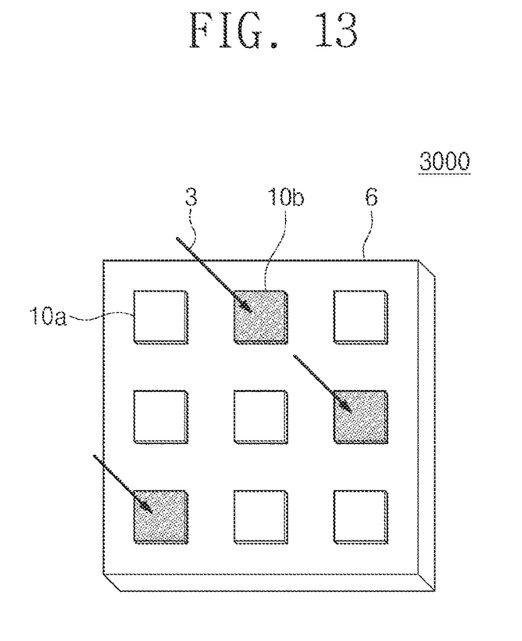
Figure 14:
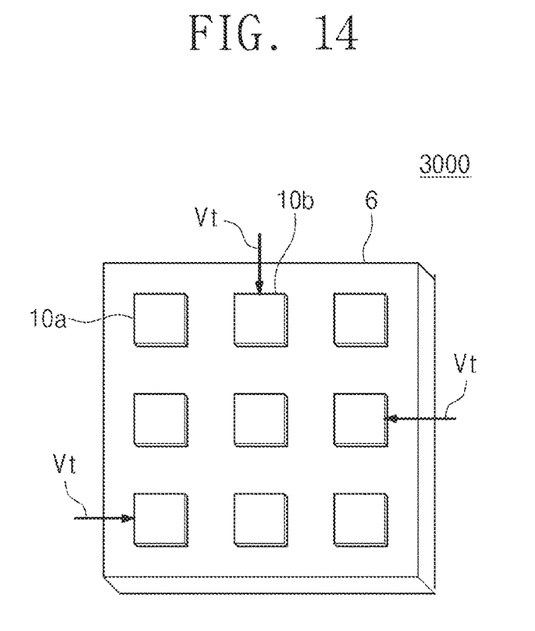

FIGS. 12 to 14 are conceptual views of an optically restorable semiconductor device according to exemplary embodiments of the present inventive concept. For conciseness of explanation, content substantially identical to those having been described in relation to FIGS. 1 to 4 may not be described.

In relation to FIG. 12, an optically restorable semiconductor device 3000 may be provided which includes a substrate 6 and optically restorable semiconductor elements 10a arrayed on the substrate 6 in an 'off' state. The 'off' state may be a first state having been described in relation to FIGS. 2 and 4.

In relation to FIG. 13, a part of the optically restorable semiconductor elements 10a in the 'off' state may be irradiated with light 3. The optically restorable semiconductor elements 10a in the 'off' state, which has been irradiated with the light 3, may be changed to the optically restorable semiconductor elements in an 'on' state. The 'on' state may be a second state having been described in relation to FIGS. 3 and 4.

In relation to FIG. 14, a trap voltage Vt may be applied to the optically restorable semiconductor elements 10b in the 'on' state to change them again to optically restorable semiconductor elements 10a in the 'off' state Each of the optically restorable semiconductor elements 10a and 10b may include a light emitting element (not shown). For example, the light emitting element in the optically restorable semiconductor element 10b in the 'on' state may generate light, and the light emitting element in the optically restorable semiconductor element 10a in the 'off' state may not generate the light. Consequently, the optically restorable semiconductor device 3000 may be a display device such as an electronic blackboard.

An electrical state of the optically restorable semiconductor device 3000 according to an embodiment of the inventive concept may be controlled by the trap voltage applied to the optically restorable semiconductor elements 10a and 10b, and the light irradiated thereon.

According to embodiments of the inventive concept, an optically restorable semiconductor device may be provided which may be driven using each of light and a voltage.

According to embodiments of the inventive concept, a method for fabricating an optically restorable semiconductor device may be provided which may be driven using each of light and a voltage.

According to embodiments of the inventive concept, a flash memory device using an optically restorable semiconductor device may be provided which may be driven using each of light and a voltage.

However, the effects of the inventive concept are not limited to the above-described disclosure.

The above-described description about the embodiments of the inventive concept provides examples for explaining the inventive concept. Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An optically restorable semiconductor device comprising:
   a gate electrode;
   a gate insulation film on the gate electrode;
   a photo-responsive semiconductor film on the gate insulation film;
   an interface charge part disposed adjacent to an interface between the photo-responsive semiconductor film and the gate insulation film; and
   a plasma treatment area provided on the gate insulation film,
   wherein the interface charge part comprises charge traps,
   wherein the interface charge part and the photo-responsive semiconductor film directly contact each other, and
   wherein the plasma treatment area directly contacts the interface charge layer and comprises deep traps.

2. The optically restorable semiconductor device of claim 1, wherein the photo-responsive semiconductor film has direct transition characteristics.

3. The optically restorable semiconductor device of claim 1, wherein the photo-responsive semiconductor film comprises an oxide semiconductor material, a sulfide semiconductor material, or a selenide semiconductor material.

4. The optically restorable semiconductor device of claim 1, wherein the interface charge part comprises an interface charge layer interposed between the photo-responsive semiconductor film and the gate insulation film, and
   wherein the interface charge layer comprises a material different from the photo-responsive semiconductor film.

5. The optically restorable semiconductor device of claim 1, wherein the interface charge part comprises an interface charge area provided on the gate insulation film, and
   wherein the interface charge area comprises deep traps.

6. The optically restorable semiconductor device of claim 1, further comprising:
   a passivation film provided on the photo-responsive semiconductor film,
   wherein the passivation film comprises $SiO_2$, SiON, SiN, $Al_2O_3$, AlSiO, AlON, or a combination thereof.

7. The optically restorable semiconductor device of claim 1, further comprising:
   a control unit; and
   an optical source unit,
   wherein the control unit applies a trap voltage to the gate electrode, and
   wherein the optical source unit is controlled by the control unit to irradiate light on the photo-responsive semiconductor film.

8. The optically restorable semiconductor device of claim 7, wherein electrical characteristics of the interface charge part are controlled by each of the trap voltage and light.

9. The optically restorable semiconductor device of claim 7, wherein the trap voltage is provided in plurality, and
   wherein magnitudes of the plurality of trap voltages are different from each other.

10. The optically restorable semiconductor device of claim 7, wherein the light is provided in plurality, and
    wherein wavelengths of the plurality of lights are different from each other.

11. A method of fabricating an optically restorable semiconductor device comprising:
    providing a gate electrode;
    forming a gate insulation film on the gate electrode;
    forming a photo-responsive semiconductor film on the gate insulation film; and
    forming an interface charge part on an area adjacent to an interface between the gate insulation film and the photo-responsive semiconductor film,
    wherein the interface part comprises charge traps,
    wherein the forming of the interface charge part comprises performing a plasma treatment process or a solution treatment process on a top surface of the gate insulation film,
    wherein the plasma treatment process comprises exposing the top surface of the gate insulation film to a plasma, and
    wherein the solution treatment process comprises exposing the top surface of the gate insulation film to an acid.

12. The method of claim 11, wherein the plasma is generated using a $H_2$ gas, an $O_2$ gas, a $Cl_2$ gas, a F gas, a gas comprising a hydrogen atom, or a mixed gas comprising at least two thereof.

13. The method of claim 11, wherein the acid comprises any one of a sulfuric acid, a nitric acid, an acetic acid, a hydrochloric acid, and a hydrofluoric acid.

14. The method of claim 11, wherein the forming of the interface charge part comprises forming an interface charge layer interposed between the gate insulation film and the photo-responsive semiconductor film, and
    wherein the interface charge layer comprises a material different from a material in the photo-responsive semiconductor film.

15. A flash memory device comprising:
    a substrate;
    a control gate separated from the substrate in a direction perpendicular to a bottom surface of the substrate;
    a gate insulation film provided between the substrate and the control gate;
    a floating gate interposed between the substrate and the gate insulation film;
    a source electrode and drain electrode respectively disposed on sides of the floating gate; and
    a plasma treatment area provided on the gate insulation film,
    wherein the substrate comprises a photo-responsive semiconductor material,
    wherein the floating gate comprises charge traps,
    wherein the substrate and the floating gate directly contact each other,
    wherein a write operation and an erase operation are performed by a trap voltage applied to the control gate and light irradiated on the substrate, and
    wherein the plasma treatment area directly contacts the floating gate and comprises deep traps.

16. The flash memory device of claim 15, wherein the photo-responsive semiconductor material has direct transition characteristics.

* * * * *